(12) United States Patent
Letz et al.

(10) Patent No.: US 7,781,343 B2
(45) Date of Patent: Aug. 24, 2010

(54) SEMICONDUCTOR SUBSTRATE HAVING A PROTECTION LAYER AT THE SUBSTRATE BACK SIDE

(75) Inventors: Tobias Letz, Dresden (DE); Holger Schuehrer, Dresden (DE); Markus Nopper, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 523 days.

(21) Appl. No.: 11/757,575

(22) Filed: Jun. 4, 2007

(65) Prior Publication Data
US 2008/0132072 A1 Jun. 5, 2008

(30) Foreign Application Priority Data
Nov. 30, 2006 (DE) .................. 10 2006 056 598

(51) Int. Cl.
*H01L 21/311* (2006.01)
(52) U.S. Cl. ............... 438/694; 438/692; 438/702; 438/745; 438/753; 216/37; 216/41; 216/99; 216/100; 216/108; 347/64; 347/65; 347/66; 347/84; 347/85
(58) Field of Classification Search .......... 438/694, 438/692, 702, 745, 753, 756; 216/37, 41, 216/99, 100, 108; 347/64–85
See application file for complete search history.

(56) References Cited
U.S. PATENT DOCUMENTS
6,431,687 B1 * 8/2002 Wuu et al. .............. 347/64
6,555,480 B2 * 4/2003 Milligan et al. ......... 438/719

FOREIGN PATENT DOCUMENTS
DE 102 44 077 A1 3/2004
DE 102 53 163 A1 5/2004
DE 10244077 * 11/2004

OTHER PUBLICATIONS

Translation of Official Communication from German Patent Office for German Patent Application No. 10 2006 056 598.3-33 dated Jul. 9, 2007.

* cited by examiner

*Primary Examiner*—Lan Vinh
*Assistant Examiner*—Maki A Angadi
(74) *Attorney, Agent, or Firm*—Williams, Morgan & Amerson, P.C.

(57) ABSTRACT

By forming a protection layer on the back side of a substrate prior to any process sequences, which may deposit material or material residues on the back side, the respective back side uniformity may be significantly enhanced, thereby also increasing process efficiency of subsequent back side critical processes, such as lithography, back end of line processes and the like. In one illustrative embodiment, silicon carbide may be used as a material for forming a respective protection layer.

20 Claims, 4 Drawing Sheets

SEMICONDUCTOR SUBSTRATE HAVING A PROTECTION LAYER AT THE SUBSTRATE BACK SIDE

BACKGROUND OF THE INVENTION

1. Field of the Invention

Generally, the present disclosure relates to the fabrication of integrated circuits, and, more particularly, to techniques for enhancing the overall process flow by considering characteristics of the back side of substrates during various manufacturing stages.

2. Description of the Related Art

Semiconductor devices are typically formed on substantially disc-shaped substrates made of any appropriate material. One prominent type of semiconductor material is silicon, since the majority of semiconductor devices including highly complex electronic circuits is currently, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array form, wherein most of the manufacturing steps, which may add up to 500-1000 and more individual process steps in sophisticated integrated circuits, are performed simultaneously for all chip areas on the substrate, except for a few processes, such as photolithography processes, certain metrology processes, packaging of the individual devices after dicing the substrate and the like. Thus, economic constraints drive semiconductor manufacturers to steadily increase the substrate dimensions, thereby also increasing the area available for producing actual semiconductor devices.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the peripheral chips are positioned as closely to the substrate perimeter as it is compatible with substrate handling processes. Generally, most of the manufacturing processes are performed in an automated manner, wherein the substrate handling is performed at the back side of the substrate and/or the substrate edge, which typically includes a bevel at least at the front side of the substrate.

The fabrication of microstructures, such as integrated circuits, requires tiny regions of precisely controlled size to be formed in a material layer located on the front side of the substrate. These tiny regions of precisely controlled size are generated by patterning the material layer by performing lithography, etch, implantation, deposition, oxidation processes and the like, wherein each of the corresponding processes has to be performed within strictly defined process windows. That is, the result of a patterning process may depend on the layer thickness of the deposition process, the quality of the lithography process, the fidelity of the etch process and the like. As an example of a highly complex manufacturing sequence, the fabrication of a gate electrode of a field effect transistor may be referred to, which represents an important component of modern digital circuits. Since the dimensions of the field effect transistor substantially determine operating speed and packing density of the integrated circuit, the patterning of the gate electrode is a highly critical process stage. In well-established MOS technologies, the critical gate forming process may include the formation of an appropriate gate insulation layer followed by the deposition of a gate electrode material and possible further materials, such as anti-reflective coating (ARC), required for the subsequent lithography process. Typically, at least a mask layer may be formed above the gate material layer, which may consist of or may be formed by means of a layer of photoresist that is patterned by the photolithography process. During the photolithographic process, the resist may be spin-coated onto the surface and then selectively exposed to ultraviolet radiation through a corresponding lithography mask, such as a reticle, thereby imaging the reticle pattern into resist layer to form a latent image therein. After developing the photoresist, depending on the type of resist, positive resist or negative resist, the exposed portions or the non-exposed portions are removed to form the required pattern in the layer of photoresist. Based on this resist pattern, the actual gate patterns may be formed by a complex etch sequence. Since the dimensions of the gate electrodes in sophisticated integrated micro-structure devices are steadily decreasing, the equipment used for forming the gate electrodes have to meet very stringent requirements with regard to resolution and overlay accuracy of the involved fabrication processes. For example, the ability of the exposure process to create minute resist features may depend on critical parameters, such as numerical aperture, depth of focus and wavelength of the light source used. Consequently, modern lithography tools may have a reduced depth of focus, thereby requiring precisely defined layer thicknesses as well as accurate mechanical positioning of the substrate. As previously explained, substrate handling, supporting and positioning is typically accomplished by contacting the back side of the substrate by vacuum grippers, wafer chucks and the like. Hence, although the actual patterning process occurs at the front side of the substrate, the characteristics of the back side may also have a significant effect on the process result, in particular, when highly scaled devices are considered. For example, the presence of particles on the back side may result in defocused exposure fields due to the reduced depth of focus.

Also, in other process stages, the status of the back side may have an important influence on the processes performed at the front side. For instance, at the final phase of the manufacturing process of integrated circuits, solder bumps are typically provided, a metallization is formed on the back side and the separated die are attached to appropriate packages. In this sequence, surface characteristics, such as surface roughness, defectivity, chemical composition and the like, may represent important factors. In conventional process strategies, these factors may be difficult to be controlled, since many of the processes, such as deposition processes, wet chemical processes and the like, may also affect the back side of the substrate, however, in a highly unpredictable manner. For example, the deposition of the gate electrode material, which is frequently provided in the form of polysilicon, may be performed on the basis of a furnace process in a controlled ambient, to which is also exposed the substrate back side, resulting in the deposition of polysilicon also on the back side. Other deposition processes may be chemical vapor deposition (CVD), physical vapor deposition (PVD) and the like, which may result in a highly unpredictable coverage of portions of the back side, thereby affecting subsequent processes in a highly uncontrollable manner. Consequently, with increasing dimensions of the substrates used in fabricating microstructures and the continuous demand for reduced critical dimensions of the individual features, the characteristics of the substrate back side may have an increasing influence on production yield, wherein presently practiced process strategies may suffer from insufficient controllability of the properties of the substrate back side.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is related to a technique for reducing influences caused by non-uniformities generated at the back side of a substrate during the processing of microstructure devices. To this end, the respective back side of the substrate under consideration may be efficiently protected, at least prior to manufacturing processes which typically may affect the back side. The protection of the back side may be accomplished on the basis of an appropriate protective material that may enable the reduction of non-uniformities at the back side, which may be caused by deposition-related contaminations and the like, wherein, after the corresponding treatment, superior surface characteristics may be established compared to a non-protected back side as is used in conventional techniques. Consequently, the further manufacturing sequence may be continued on the basis of significantly reduced non-uniformities or on the basis of well-defined surface characteristics with respect to defectivity, surface roughness, chemical composition and the like, thereby significantly enhancing the overall process result in the subsequent manufacturing stages. In some illustrative embodiments, the corresponding protective material may comprise a highly inert material composition, which may have a high resistivity against a plurality of reactive etch ambients, such as wet chemical etch ambients typically used in a plurality of manufacturing stages for removing unwanted material portions from the back side. Any etch damage, which may typically be caused in conventional strategies and which may therefore result in corresponding non-uniformities, may be significantly reduced by the protective material, thereby enhancing the performance of further critical processes such as lithography processes, metallization processes and the like.

According to one illustrative embodiment disclosed herein, a method comprises forming a protection layer on a back side of a substrate, wherein the substrate has a front side for forming therein and thereon microstructure features. The method further comprises performing at least one manufacturing process for forming a microstructure feature on the front side of the substrate. Finally, the method comprises removing material from above the back side during the at least one manufacturing process using the protection layer as a barrier against damaging of the back side.

According to another illustrative embodiment disclosed herein, a method comprises forming microstructure features above a front side of a substrate by a plurality of manufacturing processes, wherein at least one of the plurality of manufacturing processes affects a back side of the substrate. Furthermore, a protection layer is formed on the back side while preventing formation of the protection layer at least at a center portion of the front side, wherein the protection layer is formed prior to the at least one manufacturing process.

According to yet another illustrative embodiment disclosed herein, a substrate is provided wherein the substrate comprises a back side and a front side that is configured to form therein and thereon microstructure devices. The substrate further comprises a protection layer formed on the back side, wherein the protection layer has a high resistivity with respect to a plurality of wet chemical etch recipes compared to the non-protected material of the back side.

BRIEF DESCRIPTION OF THE DRAWINGS

The disclosure may be understood by reference to the following description taken in conjunction with the accompanying drawings, in which like reference numerals identify like elements, and in which:

FIGS. 1$b$-1$d$ schematically illustrate cross-sectional views of a substrate during a typical process flow for forming microstructure features on the basis of a protection layer formed at least on the back side of the substrate according to further illustrative embodiments;

Figure 1A:
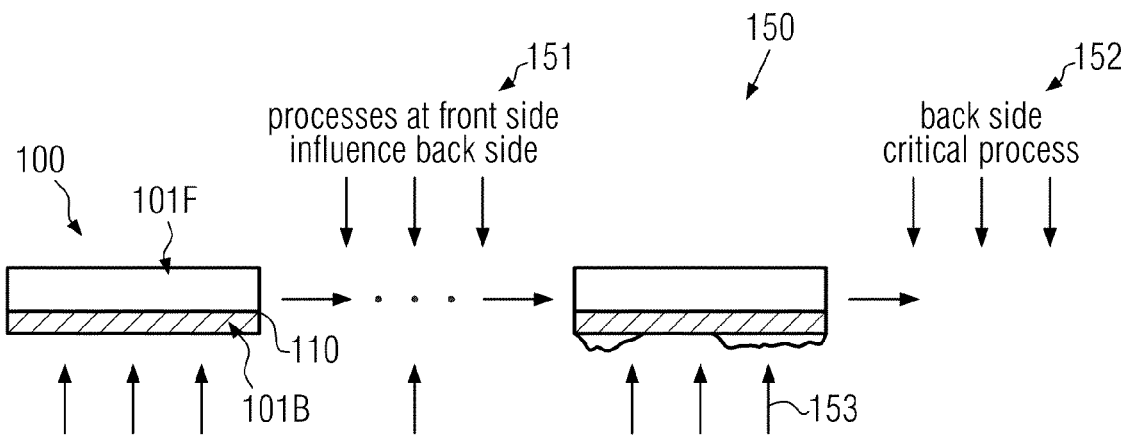
FIG. 1$a$ schematically illustrates a typical manufacturing process sequence for forming microstructure features, such as integrated circuits, on or above the front side of a substrate while using, at least temporarily, a protection layer formed on the back side according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for improving the surface characteristics of a substrate back side during a manufacturing sequence for forming microstructure devices above a respective front side of the substrate. As previously explained, with further scaling of the critical dimensions of microstructure devices, possibly in combination with increased substrate diameters, the respective process results of manufacturing processes for forming microstructure features in and above the front side of an appropriate substrate may also be influenced by the characteristics of the back side during the various manufacturing stages. For example, the planarity of the back side surface may significantly affect the overall handling characteristics of the substrate since respective substrate support members may rely on the mechanical surface characteristics of the back side. Thus, even minute thickness fluctuations at the back side may significantly affect the handling and supporting characteristics during various manufacturing stages, which may even result in a reduced mechanical stability during certain processes, thereby increasing the risk for substrate loss and the like. In other cases, as previously explained, respective local height differences which may, for instance, be caused by respective defect particles and the like may have a significant influence on lithography processes, since corresponding automatic alignment and focusing procedures and exposure processes may depend on a high mechanical accuracy of the substrate support in combination with respective substrate back side uniformity. In other cases, respective non-uniformities at the back side may have an influence on processes occurring at a very late stage of the overall manufacturing process flow, thereby possibly contributing to a high yield loss of substantially completely processed microstructure devices. For instance, respective process sequences for forming metallization structures including solder bumps, back end metallizations and finally packaging the separated dies may be increasingly dependent on well-defined surface characteristics of the back side. Since pronounced processing of the back side of substrates at a very late manufacturing stage may per se involve a high risk for yield losses, the subject matter disclosed herein provides a technique for efficiently protecting the back side, at least prior to back side critical processes, in order to obtain well-defined surface characteristics during further manufacturing processes.

An efficient protection of the back side surface may be accomplished by providing at an appropriate manufacturing stage a protection layer, at least at the back side of the substrate, wherein the corresponding material of the protection layer may exhibit different characteristics compared to the material of the back side. These differences may enhance performance of respective process steps, for instance in view of removing unwanted materials from the back side, without significantly affecting the overall surface characteristics so that further processing may be continued on the basis of enhanced process conditions. In some illustrative embodiments, the protection layer itself may be provided in the form of a substantially inert material with respect to a plurality of reactive etch ambients, which are typically used in well-established process strategies for removing material from the back side, thereby significantly reducing the risk for a surface degradation at the back side, which may typically be encountered in conventional strategies without protecting the corresponding substrate surface. In other illustrative embodiments, the corresponding protection layer may act as a "buffer" layer, which may also be affected by corresponding back side processes, wherein, however, any non-uniformities caused by the back side processes, such as etch damage and the like, may be reduced in a subsequent process substantially without transferring the respective non-uniformities into the actual back side material of the substrate. In some aspects, the concept of a protection layer formed at the back side of the substrate may be applied at a very early manufacturing stage, for instance in some illustrative embodiments prior to performing any deposition processes, thereby substantially avoiding the deposition of any materials at the back side prior to the formation of the protection layer. In other cases, a corresponding protection layer may be provided at any appropriate manufacturing stage, for instance prior to critical metallization processes, when respective influences of the back side caused by previously performed manufacturing processes are considered less critical. In still other illustrative embodiments, a respective protection layer may be formed at two or more process stages and may be removed at any appropriate manufacturing stage, thereby providing a high degree of flexibility in selecting appropriate materials since the corresponding protective materials may be specifically designed for reducing the degree of non-uniformities at a certain manufacturing stage, while a differently designed protection layer may be used in a different manufacturing stage.

It should be appreciated that the subject matter disclosed herein is highly advantageous in the context of complex microstructure devices, such as advanced integrated circuits, which may typically include complex metallization regimes, for instance on the basis of highly conductive metals, such as copper and the like, since here the corresponding design rules for achieving the critical dimensions require precisely defined conditions for lithography processes, wafer handling activities, respective back side characteristics during the formation of metallization structures, enhanced barriers for avoiding or at least significantly reducing any unwanted contamination of sensitive device areas by copper and the like. The concept disclosed herein may, however, also be advantageously applied to the formation of any other microstructure devices with less critical requirements with respect to the fabrication process. Hence, the present invention should not be understood as being restricted to specific types of microstructure devices and a certain technology node, unless such restrictions are explicitly set forth in the specification and/or the appended claims.

It should further be appreciated that any positional statements used in this application describing the position of microstructure features, such as layers, certain regions, interfaces and the like, may be understood as relative statements with respect to the corresponding substrate surfaces. For example, when referring to the front side of a substrate, a relatively planar surface, at least at an initial manufacturing state of the substrate, may be referred to, wherein any statements with respect to the front side should be related to the corresponding surface of the substrate, which may be considered as a reference plane. For example, a first component may be located above a second component with respect to the front side of the substrate when a distance of the second component to the front side surface of the substrate is less compared to the first component. Similarly, a "vertical" direction may represent a direction substantially perpendicular to the front side surface or the back side surface of the substrate, while a "horizontal" or "lateral" direction may represent a direction that is substantially parallel to the respective substrate surfaces. Similarly, when referring to the back side of the substrate, in this case, a respective first material layer may be located "above" a second material layer when the distance of the second material layer with respect to the back side surface of the substrate is less compared to the respective distance of the first material layer.

FIG. 1a schematically illustrates a manufacturing sequence 150, which may comprise a plurality of manufacturing processes, designed to act on one or more substrates 100 having a front side 101F and a back side 101B. The respective manufacturing processes of the sequence 150 may be designed to create respective microstructure features or any other components in and above the front side 101F, wherein at least some of the respective manufacturing processes, indicated as processes 151, may also affect the back side 101B of the substrates 100. That is, the corresponding processes 151 may represent, in some illustrative embodiments, deposition processes during which at least portions of material may also be deposited on and above the back side 101B, which may therefore have a significant influence on the overall surface characteristics of the back side 101B. It should be appreciated that the processes 151 may include a plurality of process steps, which may possibly result in modified characteristics of the back side 101B while not necessarily affecting the mechanical characteristics thereof, such as surface roughness, thickness non-uniformities and the like. For instance, as previously explained, in highly sophisticated semiconductor devices, copper may typically be used as a metal material for forming advanced metallization structures. As is well known, copper may readily diffuse in a plurality of dielectric materials and semiconductor materials, such as silicon, silicon dioxide and the like. When reaching sensitive device areas, such as respective active regions of field effect transistors, even tiny amounts of copper may affect the corresponding electrical characteristics in a highly unpredictable and thus uncontrollable manner. For example, even minute amounts of copper introduced into the back side 101B of the substrate 100 may therefore result in significant yield loss. A corresponding copper contamination may be created by contact with contaminated process tools, substrate support, robot arms and the like and may thus have a significant effect without actually altering the mechanical characteristics of the back side 101B.

Moreover, the manufacturing sequence 150 may also include one or more manufacturing processes 152, in which the characteristics of the back side 101B may have a significant influence on the overall process output. As previously explained, critical lithography steps rely on precisely defined mechanical characteristics of the back side 101B and, of course, precisely defined conditions on and above the front side 101F, while other processes, such as the formation of metallization structures, forming solder bumps, providing a metal contact on the back side 101B, the packaging process and the like, may require well-defined mechanical and chemical conditions at the back side 101B. Consequently, prior to passing the substrate 100 through the manufacturing sequence 150, at least one of the processes 151 and 152 may be identified which may require improved surface characteristics of the back side 101B in order to enhance the overall process output. In this case, prior to performing the corresponding identified process 151, the substrate 100 may receive a corresponding protection layer 110 formed on the back side 101B in order to provide enhanced surface characteristics during the further processing, and in particular during the one or more back side critical processes 152. In some illustrative embodiments, the protection layer 110 may be comprised of a material, at least at a surface portion thereof, that is, at a surface area facing away from the back side 101B, that has significantly different characteristics compared to the original material of the back side 101B so that at least one characteristic of the back side 101B may be enhanced compared to conventional strategies. In one illustrative embodiment, the protection layer 110 may comprise a material having a high etch resistivity with respect to one or more wet chemical etch recipes that may typically be used during the processing of the substrates 100, in particular for removing unwanted material portions from above the back side 101B. For example, if the manufacturing process 151 represents a corresponding deposition process, which may also affect the back side 101B, a corresponding wet chemical etch process may be performed so as to efficiently remove unwanted material from the back side, wherein the increased etch resistivity of the protection layer 110 may thus result in a reduced degree of etch-induced damage, thereby providing a superior surface compared to conventional strategies, in which the back side 101B may be damaged by the corresponding etch process, resulting in increased roughness and the like. In conventional strategies, respective etch damage, even to a minute degree, may have a negative influence on further substrate handling processes, lithography processes and the like, as previously explained.

In other illustrative embodiments, additionally or alternatively to having a high etch resistivity with respect to specified wet chemical etch recipes, the protection layer 110 may also act as an efficient diffusion barrier, for instance for copper diffusion, thereby significantly reducing the risk for copper contamination of sensitive device areas within the substrate 100. In some illustrative embodiments, the protection layer 110 may comprise one or more layers of different material composition in order to appropriately adjust the overall characteristics of the protection layer 110 with respect to the manufacturing sequence 150. For example, one or more sub-layers may provide respective diffusion preventing characteristics while a further sub-layer may provide the required etch stop characteristics during one of the processes 151 or 152. Respective embodiments involving different materials within the protection layer 110 will be described in more detail later on.

Thus, after forming the protection layer 110 on the basis of any appropriate process technique, such as chemical vapor deposition (CVD), physical vapor deposition (PVD), epitaxial growth techniques, ion implantation and the like, the substrate 100 may be subjected to one or more of the processes 151. In one illustrative embodiment, the protection layer 110 may be provided prior to the first deposition process in the entire manufacturing sequence for forming respective microstructure devices in and above the front side 101F, thereby enabling a high degree of process uniformity from the beginning of the entire process flow. For example, respective substrates 100 having the protection layer 110 may be provided by a substrate supplier as a "raw material" for the fabrication of semiconductor devices. In other cases, one of the processes 151 may include a deposition process which may not be reliably restricted to the front side 101F, thereby also creating a certain amount of material residues on and above the back side 101B. In other illustrative examples, the respective deposition process may result in a substantially continuous coverage of the back side 101B, as may be the case during the deposition of gate electrode material for sophisticated MOS devices, wherein typically polysilicon may be used as a gate electrode material. In many strategies, the corresponding polysilicon material may be deposited on the basis of a furnace process in the presence of a corresponding ambient, and therefore any exposed surface portions of the substrate 100, including the back side, may receive a corresponding polysilicon material. It should be appreciated that typically, prior to the deposition of a corresponding gate electrode material, a gate insulation layer may be formed which may be accomplished on the basis of sophisticated oxidation and/or deposition processes. Also in this case, respective dielectric material may also be formed on exposed surface portions on and above the back side 101B. In one illustrative embodiment, the protection layer 110 may be formed after the deposition and/or oxidation of the respective gate insulating materials while, in other cases, a certain degree of gate dielectric may also be formed on the protection layer 110.

After the corresponding process 151, which may significantly affect the back side 101B, for instance by providing respective material residues on the protection layer 110, the substrate 100 may be subjected to a process 153 for processing the back side 101B, i.e., the protection layer 110 formed thereabove. In some illustrative embodiments, the process 153 may represent a wet chemical etch process on the basis of an appropriate etch chemistry that may efficiently remove any unwanted material residues or even continuous material layers formed on the protection layer 110 during the preceding process 151. During the process 153, the protection layer 110 may act as an efficient barrier with respect to the creation of undue surface non-uniformities above the back side 101B. In one illustrative embodiment, the protection layer 110 may represent an efficient etch stop layer with respect to the reactive ambient of the process 153 so that the surface characteristics of the protection layer 110 may not be unduly degraded compared to respective etch damage that would be created in an exposed surface of the back side 101B. In one illustrative embodiment, the protection layer 110 may comprise a silicon carbide (SiC) material, at least at a surface portion thereof, since silicon carbide is a well-known material having a high etch resistivity against the etch attack of a plurality of wet chemical recipes. Since silicon carbide may act as a substantially inert material with respect to wet chemical etch recipes as are typically used for etching silicon dioxide, silicon, silicon nitride, or other materials frequently used in the processing of micro-structure devices, upon removing unwanted material portions during the process 153, the mechanical integrity of the surface of the protection layer 110 may remain substantially intact. Consequently, after the process 153, the substrate 100 may be subjected to one or more of the back side critical processes 152, for instance to a lithography process, wherein the corresponding enhanced surface integrity may provide significantly reduced exposure fluctuations. In some illustrative embodiments, the protection layer 110 may be maintained throughout a plurality of manufacturing stages wherein respective back side etch processes, such as the process 153, may be intermittently performed as required, wherein the high resistivity of the protection layer 110 may nevertheless provide a high degree of surface integrity and thus enhanced back side uniformity. For instance, the protection layer 110 may be advantageously used during the formation of complex metallization structures wherein, in addition to the enhanced mechanical surface characteristics, a well-defined chemical condition may also be provided for the respective manufacturing processes. Furthermore, when the protection layer 110 may have incorporated therein a respective material or may itself provide a high degree of copper diffusion hindering characteristics, a corresponding copper contamination of sensitive transistor areas may be significantly suppressed. In other illustrative embodiments, the protection layer 110 may be removed at any appropriate process stage, as will be described later on in more detail, and a further protection layer having the same material composition or a different material composition may be formed prior to performing a further process 151 having a significant influence on the back side 101B, as previously described.

Figure 1B:
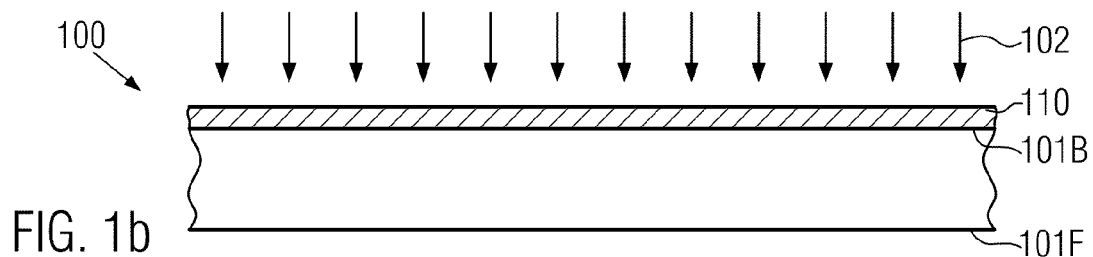

FIG. 1b schematically illustrates a cross-sectional view of the substrate 100 during a process 102 for forming the protection layer 110. The process 102 may represent any appropriate deposition process such as a CVD process for forming the protection layer 110 with a desired material composition on or above the back side 101B. For instance, well-established deposition recipes are available for silicon carbide, which may be used for forming the protection layer 110 at any appropriate manufacturing stage. For example, the substrate 100 may be positioned upside down in an appropriate deposition chamber and may be processed so as to form the protection layer 110 with a specified layer thickness. Thereafter, the front side 101F may be appropriately processed in order to remove any contaminants that may have been created during the process 102. In other process strategies, the process 102 may comprise an oxidation process for forming a respective liner material (not shown) which may represent a part of the protection layer 110 at the back side 101B, while efficiently providing protective material for the front side 101F, when removing unwanted material or cleaning the front side 101F after the process 102. It should be appreciated that the process 102 may have an inherent high degree of uniformity appropriate to maintain overall surface uniformity, for instance with respect to thickness variations, at a level comparable to the base characteristics of the back side 101B. In other illustrative embodiments, the process 102 may comprise, prior to or after the deposition of the protection layer 110, appropriate planarization steps in order to enhance the surface uniformity of the protection layer 110. For instance, a polishing process may be performed in order to reduce any thickness variations of the protection layer 110.

Figure 1C:
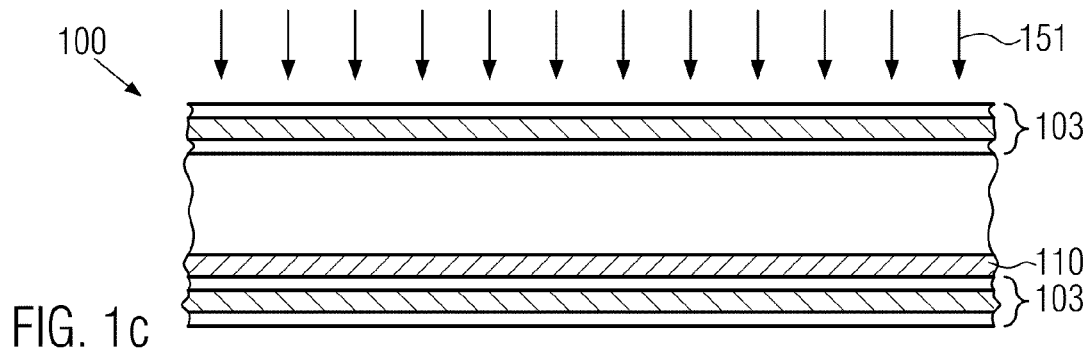

FIG. 1c schematically illustrates the device 100 during one of the processes 151, which may result in the formation of a respective layer 103, which may comprise one or more sublayers, depending on process requirements. As previously explained, during the patterning of gate electrodes of sophisticated integrated circuits, two or more material layers, such as a gate insulation layer, a gate electrode material such as polysilicon, an ARC material such as silicon oxynitride, silicon nitride and the like, may be deposited wherein at least one of these processes may also significantly affect the back side 101B. Consequently, during the process 151, a respective material 103 may also form on the protection layer 110.

Figure 1D:
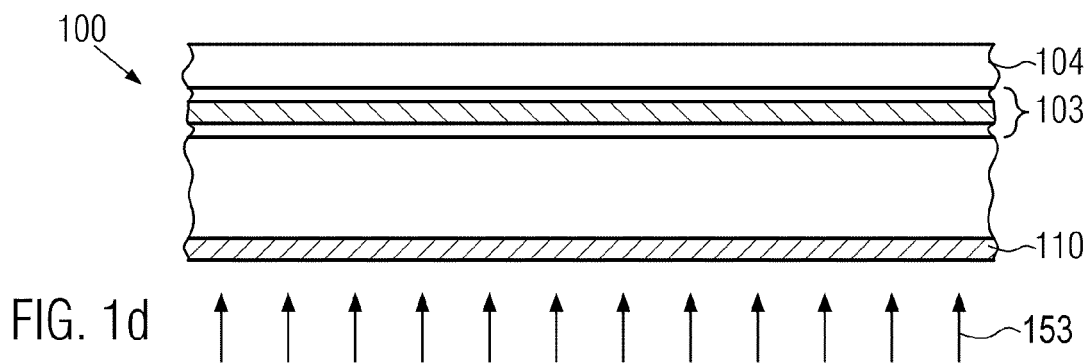

FIG. 1d schematically illustrates the substrate 100 during the process 153 for removing the material layer 103 from the back side, i.e., from the protection layer 110, by an appropriately designed wet chemical etch process. For instance, a respective etch chemistry may be selected for removing polysilicon material, possibly in combination with any ARC material and gate insulation material, if formed on the protection layer 110, wherein the protection layer 110 may act as an efficient etch stop layer substantially without suffering significant damage if, for instance, silicon carbide is used as the material for the layer 110, at least in a surface portion thereof. Furthermore, a material layer 104 may be formed above the front side 101F as may be required for the patterning of the material layer 103. For instance, the layer 104 may represent a resist material that may be used in a subsequent lithography process, wherein the enhanced surface characteristics of the protection layer 110, even after the removal process 153, may provide superior process conditions. As a consequence, the protection layer 110 may significantly enhance performance of the processes 152 by reducing contamination and/or adverse effects of the processes 153.

With reference to FIGS. 2a-2d, further illustrative embodiments will now be described in which an appropriate protection layer may also be formed at an edge region of the substrate on the front side thereof, in order to provide superior process conditions, especially during the formation of metallization structures in advanced semiconductor devices.

Figure 2A:
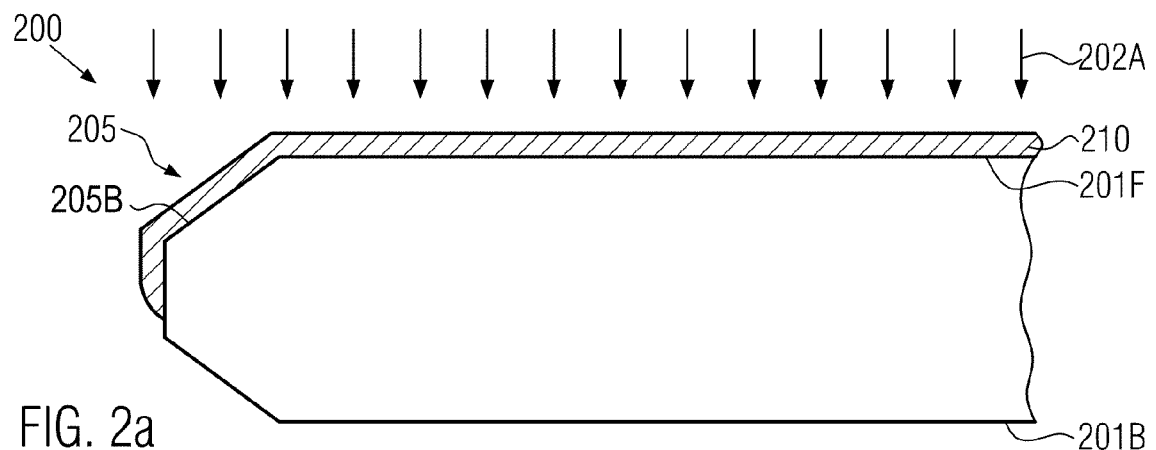
FIGS. 2$a$-2$d$ schematically illustrate cross-sectional views of a substrate during a manufacturing sequence, wherein a protective layer is formed on the back side and the bevel and edge regions of a substrate according to further illustrative embodiments.

FIG. 2a schematically illustrates a cross-sectional view of a substrate 200 having a front side 201F and a back side 201B. With respect to the characteristics of the substrate 200, the same criteria apply as previously explained with reference to the substrate 100. Typically, the substrate 200 may include an edge region 205 at the front side 201F thereof, which may not be used for actually forming any microstructure devices therein. The edge region 205 may represent a corresponding "buffer" zone with respect to process uniformities, which may typically occur at the periphery of the substrate 200 during the manufacturing processes for forming respective microstructure devices in and above the front side 201F. For example, a lateral extension of the respective edge region 205 may depend on the overall size of the substrate, the substrate handling capabilities of the respective process tools involved and the like. For instance, the edge region 205 may represent an annular region of 1-5 mm radial extension. Furthermore, the edge region 205 may typically comprise a bevel area 205B, at which a plurality of substrate handling processes may act upon, for instance, for conveying substrates from one process chamber to another by a robot handler and the like. Typically, the bevel area 205B is a critical region with respect to many process steps, such as deposition processes, since a high degree of process non-uniformity may occur in this area. Thus, in some illustrative embodiments, it is considered appropriate to also provide a corresponding protection layer at least at the bevel region 205B or even within the entire edge region 205, in order to provide superior process conditions, in particular during the formation of metallization structures in which the application of low-k dielectric materials may result in increased delamination events at the bevel region 205B due to the reduced mechanical stability of low-k dielectric materials in combination with the corresponding process non-uniformities during the deposition. Hence, the substrate 200 may be subjected to a deposition process 202A for forming a corresponding protection layer 210 above the front side 201F, wherein advantage may be taken from the fact that a plurality of CVD processes may not be restricted to horizontal portions of the front side 201F but may also provide respective material at the bevel area 205B. Hence, the protection layer 210 may also be formed in the edge region 205 including the bevel area 205B. For example, the protection layer 210 may comprise silicon carbide, which may exhibit excellent etch stop characteristics for a large number of wet chemical etch recipes, as previously described.

Figure 2B:
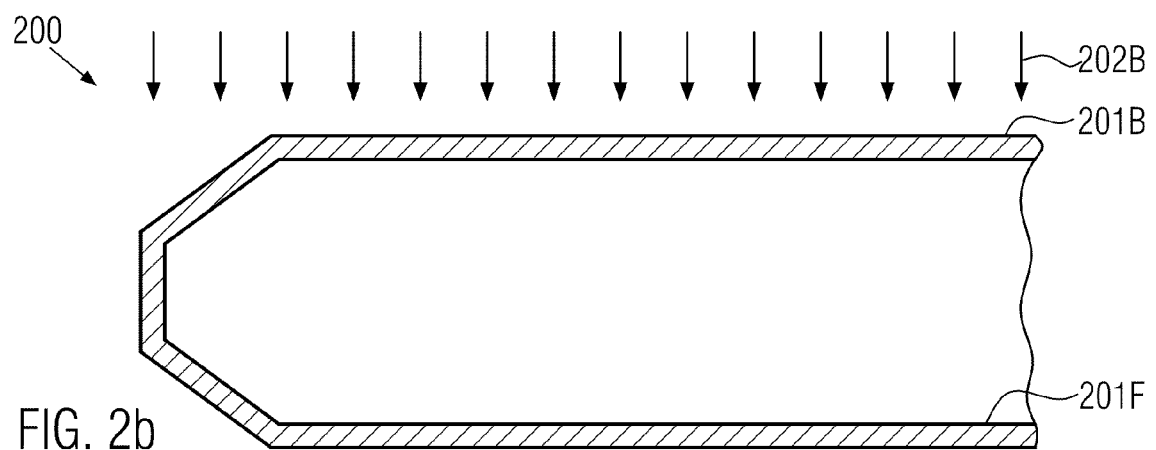

FIG. 2b schematically illustrates the substrate 200 in a further advanced process stage wherein a further deposition process 202B may be performed in order to provide the protection layer 210 also at the back side 201B, wherein also the respective bevel area 205B may be covered by the material of the layer 210, as previously explained. Hence, the protection layer 210 may substantially completely encapsulate the substrate 200, wherein, in some illustrative embodiments, the protection layer 210 may comprise one or more sub-layers which may be advantageously used for patterning the protection layer 210 in a subsequent process step. As will be explained later on in more detail, appropriate etch stop layers or buffer layers may be provided in order to reduce unwanted damage of the underlying front side 201F during a corresponding patterning process.

Figure 2C:
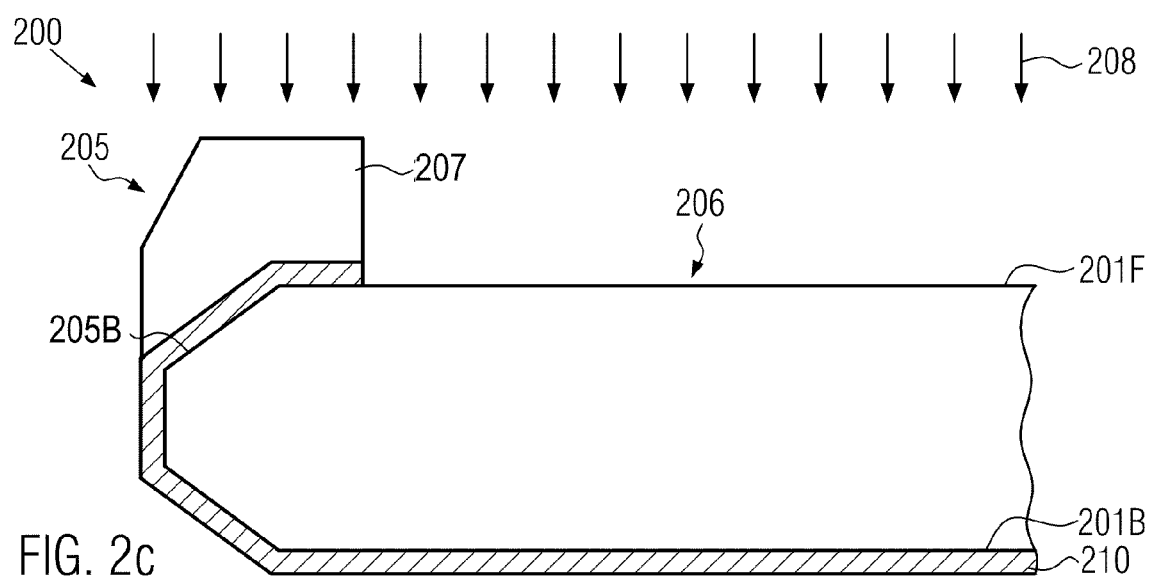

FIG. 2c schematically illustrates the substrate 200 in a further process stage for patterning the protection layer 210 so as to expose a central region 206 of the front side 201F. For this purpose, a corresponding mask layer 207 may be formed in order to cover the edge region 205 and the bevel area 205B during a respective etch process 208. In some illustrative embodiments in which the protection layer 210 may comprise silicon carbide, at least at a surface portion thereof, the etch process 208 may be designed as a reactive ion etch process on the basis of well-established etch recipes. The etch mask 207 may be comprised of any appropriate material, for instance a low-k dielectric material, since, in this case, the highly non-uniform deposition behavior of these materials, for instance based on a silicon, carbon, oxygen, hydrogen-containing material, may be exploited in order to efficiently maintain material at the edge region and the bevel area 205B. As is well known, respective low-k dielectric materials may deposit at the bevel area 205B with a significantly higher deposition rate compared to the central region 206 so that after a corresponding etch process for exposing the protection layer 210 in the center region 206, even without providing a further mask, the corresponding bevel area 205B and the edge region 205 may be reliably covered by the remaining material, thereby forming the etch mask 207. In other cases, an additional mask layer, such as a resist mask, may be formed, for instance on the basis of a negative resist, so as to form the etch mask 207. Thereafter, the process 208 may be performed in order to remove the protection layer 210 within the central region 206, which is to receive respective microstructure devices therein and thereon.

Thereafter the further processing may be continued, as is previously described with reference to FIG. 1a, wherein the protection layer 210 may provide enhanced back side characteristics during critical processes, such as lithography processes and the like. Furthermore, unwanted materials, which may accumulate within the edge region 205 and the bevel area 205B, may be efficiently removed at any appropriate manufacturing stage due to the provision of the protection layer 210, which may then be used as an efficient etch stop layer, thereby substantially avoiding damage of the substrate 200 at the front side 201F.

Figure 2D:
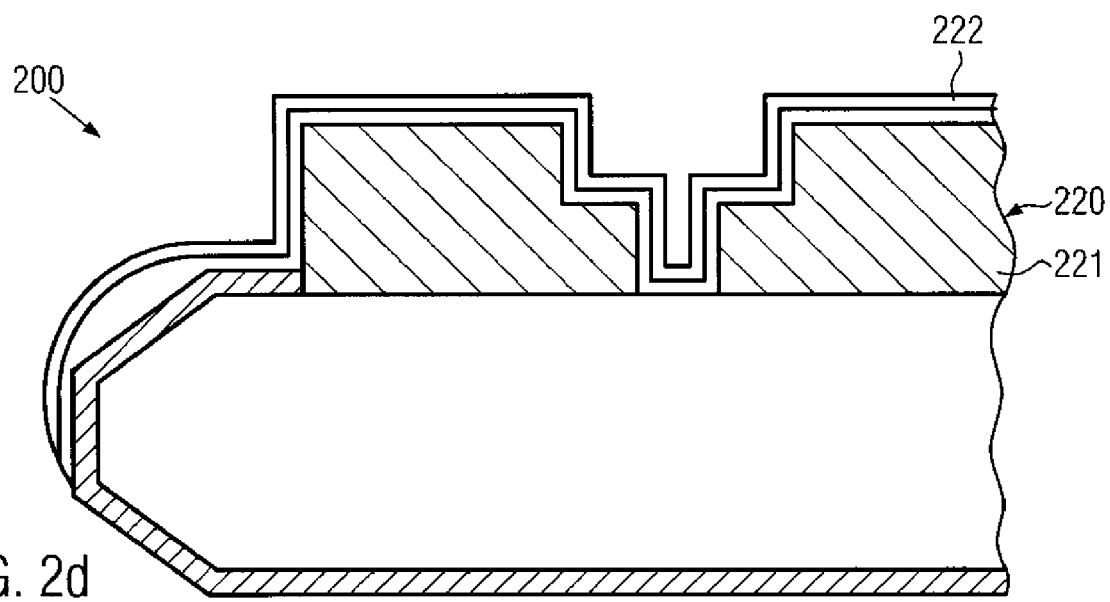

FIG. 2d schematically illustrates the substrate 200 in a further advanced manufacturing stage, wherein respective microstructure features are formed in and above the central region 206. In the embodiment shown, a respective metallization structure 220 may be formed above the central region 206, which may comprise a dielectric material 221 and respective metal-containing layers 222, wherein, in sophisticated applications, the dielectric material 221 may comprise a low-k dielectric material and the metal-containing layers 222 may represent any appropriate material compositions as are required for improving the adhesion and diffusion characteristics of the metallization structure 220. For instance, when copper or any other diffusive metals are to be used in combination with the dielectric material 221, respective conductive barrier layers are frequently used to enhance the adhesion and also prevent diffusion of copper or other highly diffusive metals into sensitive device areas. For instance, tantalum, tantalum nitride and the like may frequently be used. Similarly, the metal-containing layers 222 may comprise, in this manufacturing stage, a corresponding seed material which may be used for appropriately initiating an electrochemical deposition process for a highly conductive metal that has to be filled into respective openings provided within the dielectric material 221.

Typically, the metallization structure 220 may be formed on the basis of well-established process techniques which are usually performed after creating respective semi-conductor devices or other microstructure features in and above the central region 206. The manufacturing process for forming the metal-containing layers 222 may typically include process steps in which the deposition of the corresponding material may not be restricted to the central region 206, and hence a corresponding material may be deposited in the edge region 205 and also in the bevel area 205B, wherein frequently respective materials may also deposit above the back side 201B. Consequently, during the respective manufacturing sequence, the protection layer 210 may efficiently reduce the risk of device contamination, for instance by copper, since frequently copper material is used as a seed material while nevertheless providing the possibility for efficiently removing unwanted material from the edge region 205 and the bevel area 205B, as well as from above the back side 201B. As previously explained, the deposition non-uniformities at the edge region 205 may result in the building up of respective non-stable layer stacks when forming the metallization structure 220, which may then cause respective particles to flake off these regions, thereby contaminating the substrate 200 or any other process tools, thereby causing a significant yield loss. Consequently, by appropriately removing any unwanted materials on the basis of the protection layer 210, the probability for creating a high defect rate during the metallization process may be significantly reduced. In addition, highly uniform back side characteristics may be maintained throughout the respective manufacturing process, as is previously described.

With reference to FIGS. 3a-3e, further illustrative embodiments will now be described in which a respective back side protection layer may include one or more sub-layers for appropriately adapting the characteristics of the protection layer.

Figure 3A:
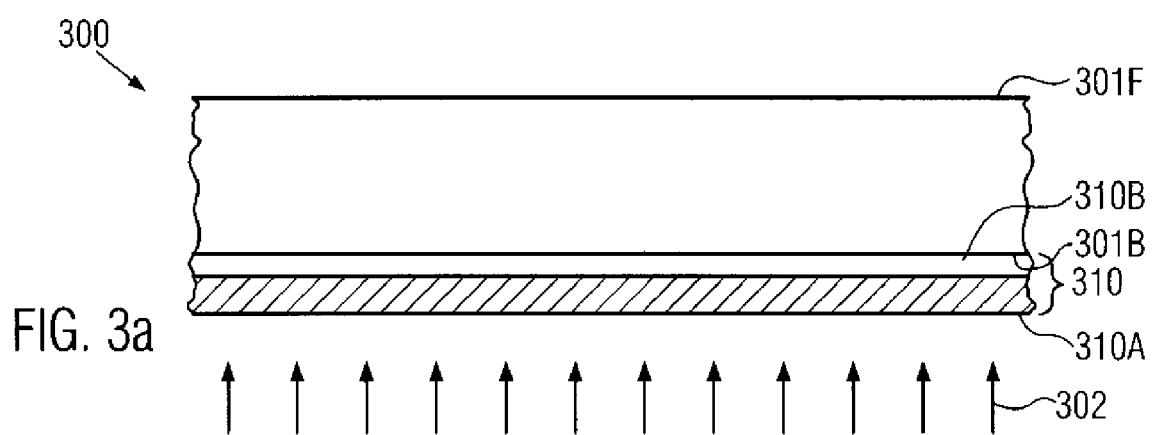
FIGS. 3$a$-3$d$ schematically illustrate cross-sectional views of a substrate having formed on the back side thereof a protection layer including one or more sub-layers at various manufacturing stages according to further illustrative embodiments.

FIG. 3a schematically illustrates a substrate 300 having a front side 301F and a back side 301B above which is formed a protection layer 310. The protection layer 310 may comprise a protective layer 310A which may exhibit a desired etch resistance with respect to wet chemical etch recipes, as previously described. For instance, the protective layer 310A may be comprised of silicon carbide, silicon nitride and the like. Furthermore, the protection layer 310 may comprise a buffer layer 310B which, in some illustrative embodiments, may represent an etch stop layer that may be used in a later manufacturing process for removing the protection layer 310. For example, the buffer layer 310B may have a different material composition compared to the layer 310A so that, in combination, the layers 310A, 310B may provide the desired overall characteristics of the protection layer 310. For instance, the layer 310B may be provided in the form of silicon nitride which may exhibit excellent copper diffusion blocking characteristics, when the protection layer 310 is also provided for providing superior copper blocking characteristics in addition to other superior back side characteristics, such as mechanical integrity and the like. In some illustrative embodiments, the buffer layer 310B may be comprised of a material that may be efficiently removed selectively with respect to material of the back side 301B, wherein a corresponding thickness of the layer 310B may be selected sufficiently low so as to allow an efficient removal of the layer 310B without significantly affecting the surface characteristics of the back side 301B. In other illustrative embodiments, the layer 310B may have etch stop characteristics with respect to the protective layer 310A so that the protective layer 310A may be efficiently removed at any appropriate manufacturing stage and subsequently the layer 310B may be removed substantially without affecting the back side 301B, thereby providing a high degree of process flexibility, since the protection layer 310 may be formed and removed at any manufacturing stage, wherein an appropriate material composition may also be selected which may provide the desired degree of protection during a specific manufacturing sequence, as is previously described with reference to FIG. 1a, while at the same time offering freedom in selecting appropriate materials and process techniques for forming the protection layer 310 depending on the process stage under consideration.

The substrate 300 as shown in FIG. 3a may be formed on the basis of an appropriately designed process 302, which may comprise a deposition process such as a CVD process, possibly in combination with an oxidation process and the like. For this purpose, well-established process recipes are available for a plurality of materials, such as silicon carbide, silicon nitride, silicon dioxide and the like, and these recipes may be used for forming the protection layer 310.

Figure 3B:
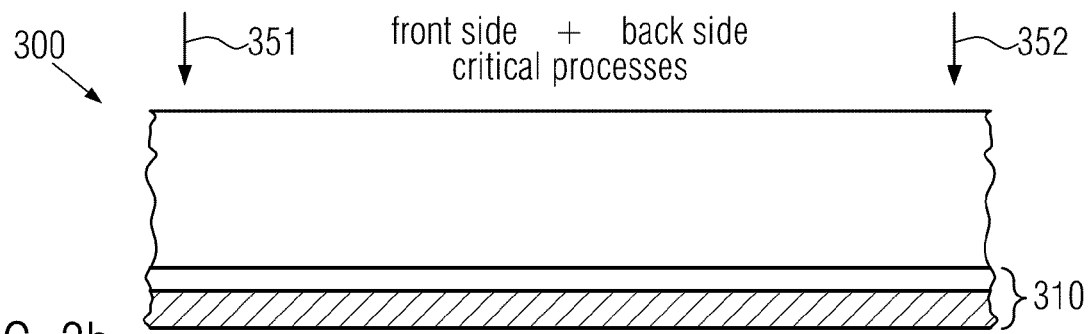

FIG. 3b schematically illustrates the substrate 300 when subjected to one or more processes 351 and 352 which may include processes affecting the back side and requiring, for instance, the removal of unwanted material residues from the back side, as well as back side critical processes, as is previously explained. Hence, during these processes, the surface characteristics of the back side may be enhanced, thereby resulting in increased process efficiency during the processes 352, as previously explained.

Figure 3C:
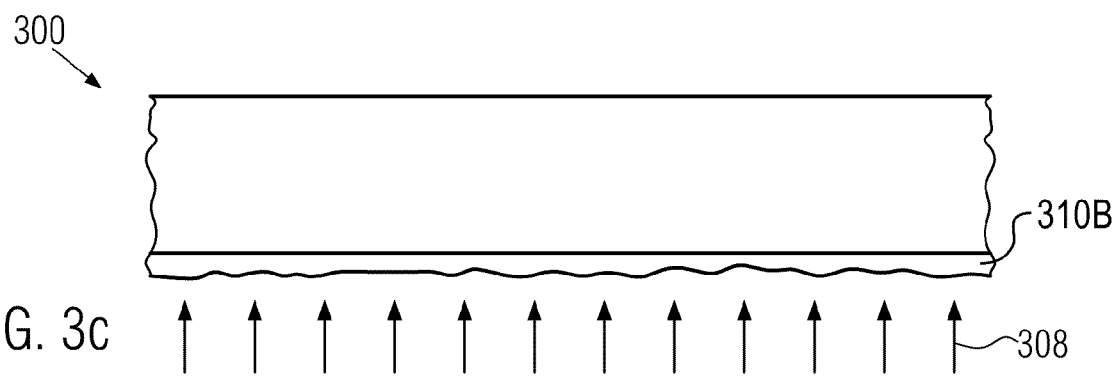

FIG. 3c schematically illustrates the substrate 300 in a further advanced manufacturing stage, wherein the protective layer 310A is removed on the basis of an appropriately designed etch process, such as a reactive ion etch process 308, for instance when the protective layer 310A may be comprised of silicon carbide. During the process 308, the buffer layer 310B may be used for controlling the material removal of the layer 310A, for instance by providing respective etch stop characteristics and/or by generating a respective endpoint detection signal which may be used for reliably stopping the process 308. Consequently, even though a certain process non-uniformity may occur in the process 308, thereby generating a certain degree of material erosion in the buffer layer 310B, the process 308 may nevertheless be reliably stopped within the buffer layer 310B, thereby avoiding undue damage of the back side 301B.

Figure 3D:
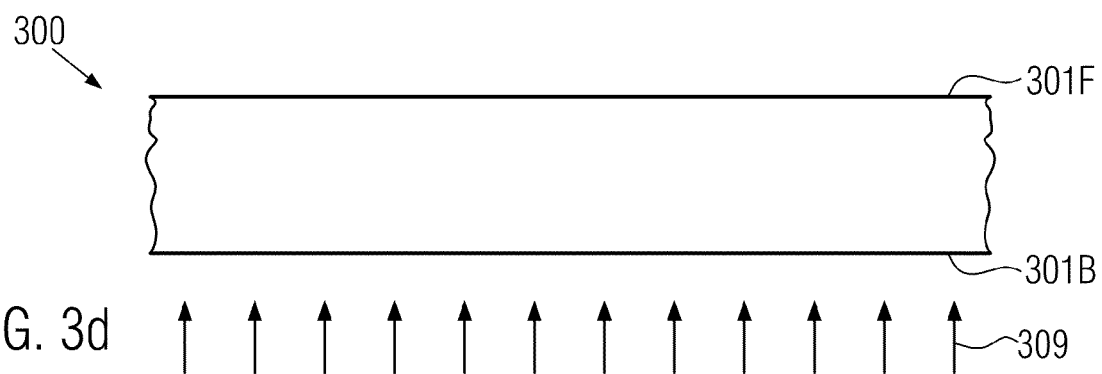

FIG. 3d schematically illustrates the substrate 300 during a further process 309 designed to efficiently remove the buffer layer 310B selectively to the back side 301B. For this purpose, highly selective isotropic or wet chemical etch recipes may be used, wherein the initial low layer thickness of the buffer layer 310B may result in reduced etch damage, thereby maintaining a high degree of integrity of the surface 301B during the further processing, such as the formation of a metal layer on the back side 301B and the like. Consequently, by providing the protection layer 310 comprised of a plurality of sub-layers, the respective protective characteristics may be tailored with respect to the respective process sequences under consideration while nevertheless enabling a reliable and efficient removal in a later manufacturing stage. In some illustrative embodiments, the protective layer 301A may be provided in the form of silicon carbide material, which may provide a high degree of surface uniformity, as is previously described, wherein the buffer layer 310B may enable an efficient removal of the silicon carbide material in a later manufacturing stage. It should be appreciated that the buffer layer 301B may be comprised of a plurality of sub-layers in order to provide an increased buffer effect during the removal of the protection layer 310. For instance, two or more layers of decreasing thickness and with corresponding etch stop characteristics with respect to a neighboring layer may be provided, thereby resulting in a decreasing degree of etch damage caused in each subsequent buffer layer, which may finally result in the highly efficient removal of the very last buffer layer, thereby efficiently reducing any etch damage caused in the back side 301B, since the very last etch step may be a very short and thus highly efficient removal process.

As a result, the subject matter disclosed herein provides a technique for significantly improving the back side uniformity of a substrate used for the formation of microstructure devices in and above a front side thereof. To this end, in some illustrative embodiments, a material of increased etch stability with respect to usually used etch chemistries for removing material residues from the back side may be provided prior to processes resulting in a contamination of the back side. Consequently, during the further processing, enhanced back side characteristics with respect to surface roughness, chemical composition and the like may be provided which may significantly enhance the overall process efficiency. In some illustrative embodiments, a respective protection layer may be formed on the basis of silicon carbide, which exhibits a high etch resistivity to a plurality of wet chemical etch recipes. In other illustrative embodiments, a corresponding protection layer may be formed in a very early manufacturing stage or, in some illustrative embodiments, the substrate may initially be provided with a protection layer formed at least on the back side of the substrate, thereby providing a high degree of process flexibility in processing the back side of the substrate prior to critical manufacturing processes. In some illustrative embodiments, the respective protection layer may also be formed on an edge region including a bevel area, thereby reducing yield losses, in particular at very late manufacturing stages, for instance during the formation of metallization structures and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a protection layer on a back side of a substrate, said substrate having a front side for forming therein and thereon microstructure features;
    performing at least one manufacturing process for forming a microstructure feature on the front side of said substrate; and
    removing material formed above said back side during said at least one manufacturing process using said protection layer as a barrier against damage of said back side.

2. The method of claim 1, wherein removing material above said back side comprises performing a wet chemical etch process using said protection layer as an etch stop layer.

3. The method of claim 2, wherein said at least one manufacturing process comprises depositing a material layer above said front side and at least on a portion of said protection layer.

4. The method of claim 3, wherein depositing said material layer comprises at least one of depositing a gate electrode material and a metal-containing material for forming a metallization structure.

5. The method of claim 1, further comprising removing said protection layer from said back side and performing at least one further manufacturing process with said back side being exposed.

6. The method of claim 5, further comprising forming a further protection layer on said exposed back side.

7. The method of claim 1, wherein said protection layer is formed prior to performing any deposition process for forming said microstructure feature in and on said front side.

8. The method of claim 1, wherein forming said protection layer comprises forming an etch stop layer above said back side and forming a protective layer on said etch stop layer, said etch stop layer having a reduced etch rate in a specified etch ambient compared to said protective layer.

9. The method of claim 8, further comprising removing said protection layer by selectively removing said protective layer using said etch stop layer as an etch stop and removing said etch stop layer selectively to said back side.

10. The method of claim 1, wherein said protection layer comprises silicon and carbon.

11. The method of claim 1, wherein said protection layer is formed on a portion of said front side.

12. The method of claim 11, wherein said portion of the front side includes at least a bevel region of said substrate.

13. A method, comprising:
    forming microstructure features above a front side of a substrate by a plurality of manufacturing processes, at least one of said plurality of manufacturing processes affecting a back side of said substrate; and
    prior to said at least one manufacturing process, forming a protection layer on said back side while preventing formation of said protection layer in at least a central portion of said front side.

14. The method of claim 13, wherein affecting said back side comprises depositing material above said back side during said at least one manufacturing process.

15. The method of claim 14, further comprising removing said material by an etch process using said protection layer as an etch stop.

16. The method of claim 13, wherein said at least one manufacturing process is a first deposition process for forming said microstructure features.

17. The method of claim 13, further comprising removing said protection layer prior to a manufacturing process for forming a metal layer above said back side.

18. The method of claim 13, wherein said protection layer comprises silicon and carbon.

19. The method of claim 13, wherein preventing formation of said protection layer in at least said central portion of said front side comprises completely removing a central portion of said protection layer formed on said front side to expose said central portion of said front side.

20. The method of claim 19, wherein completely removing said central portion of said protection layer comprises:
    forming a patterned mask layer above said front side, said patterned mask layer covering an edge portion of said front side and exposing said central portion of said front side; and
    performing an etch process to completely remove said central portion of said protection layer.

* * * * *